United States Patent
Zhou et al.

(10) Patent No.: US 8,354,887 B1
(45) Date of Patent: Jan. 15, 2013

(54) CHARGE COMPENSATION FOR OPERATIONAL TRANSCONDUCTANCE AMPLIFIER BASED CIRCUITS

(75) Inventors: Hao Zhou, Shanghai (CN); Yonghua Song, Cupertino, CA (US); Jie Jiang, Shanghai (CN); Tao Shui, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/109,315

(22) Filed: May 17, 2011

Related U.S. Application Data

(60) Provisional application No. 61/345,426, filed on May 17, 2010, provisional application No. 61/443,585, filed on Feb. 16, 2011.

(51) Int. Cl.
  *H03F 1/14* (2006.01)

(52) U.S. Cl. ........................................ 330/292; 330/252
(58) Field of Classification Search ................ 330/9, 69, 330/252, 292
See application file for complete search history.

(56) References Cited

U.S. PATENT DOCUMENTS

| | | | | |
|---|---|---|---|---|
| 5,084,639 | A * | 1/1992 | Ribner | 327/311 |
| 7,342,435 | B2 * | 3/2008 | Becker et al. | 327/534 |
| 7,639,073 | B2 * | 12/2009 | Deng et al. | 330/9 |
| 8,058,928 | B2 * | 11/2011 | Terzioglu | 330/107 |

* cited by examiner

*Primary Examiner* — Henry Choe

(57) ABSTRACT

In accordance with the teachings described herein, systems and methods are provided for charge compensation. A system may include an operational transconductance amplifier including an input terminal and an output terminal, a transistor network, and a capacitive circuit. The transistor network may be coupled in a feedback loop between the input terminal and the output terminal. The capacitive circuit may be configured to compensate a charge built on a parasitic capacitance of the transistor network during operation.

18 Claims, 7 Drawing Sheets

US 8,354,887 B1

CHARGE COMPENSATION FOR OPERATIONAL TRANSCONDUCTANCE AMPLIFIER BASED CIRCUITS

CROSS-REFERENCE TO RELATED APPLICATIONS

This application claims priority to and benefit from U.S. Provisional Patent Application No. 61/345,426, filed on May 17, 2010, and entitled "Novel Low Voltage Low Power High Speed OTA," and U.S. Provisional Patent Application No. 61/443,585, filed on Feb. 16, 2011, and entitled "Novel Low Voltage Low Power High Speed OTA." The contents of these provisional applications are incorporated herein by reference in their entirety.

FIELD

The technology described in this patent document relates generally to operational transconductance amplifier circuits. More particularly, systems and methods are disclosed for charge compensation for operational transconductance amplifier circuits.

BACKGROUND

An operational transconductance amplifier (OTA) typically receives differential input voltages and produces an output current. The OTA is similar to a standard operational amplifier in that the OTA has a high impedance differential input stage and may be used with negative feedback. The OTA may be implemented in various circuits. For example, the OTA may be used in a switched-capacitor circuit, such as a sample/hold circuit of pipelined analog-digital converters (ADCs).

FIGS. 1A and 1B show at 100 an example of a diagram of a flip-around sample/hold circuit of ADCs and an example of timing diagrams of switches in the diagram of the sample/hold circuit. As shown in FIG. 1A, the sample/hold circuit includes a differential input 102, input switches 104, an operational transconductance amplifier (OTA) 106, sample/hold capacitors 108, reference terminals 110, reference switches 112, loading capacitors 114, and feedback switches 116.

Differential input voltage signals may be provided at the differential input 102. The input switches 104 control when to pass the differential input voltage signals to input terminals of the OTA 106. A direct current (DC) common-mode voltage signal, $V_{CM}$, is supplied to the reference terminals 110 to provide proper DC points for the OTA 106. The OTA 106 may generate two output voltage signals to be applied to the loading capacitors 114. The feedback switches 116 control two feedback loops of the OTA 106.

The timing diagrams of the reference switches 112, the input switches 104, and the feedback switches 116 are shown at 118, 120, and 122 in FIG. 1B, respectively. During the sampling phase, both the input switches 104 and the reference switches 112 are on (at a logic high level) and the feedback switches 116 are off (at a logic low level). The right-side plates of the sample/hold capacitors 108 that are connected to the input terminals of the OTA 106 are set to $V_{CM}$ through the reference switches 112. The left-side plates of the sample/hold capacitors 108 that are connected to the differential input 102 through the input switches 104 are set to follow the differential input voltage signals.

After a predetermined period of time, the reference switches 112 are turned off (at a logic low level). The values of the differential input signals are stored on the sample/hold capacitors 108. The input switches 104 are turned off slightly later than the reference switches 112 so that charge injection and sampling time may be signal-independent. The left-side plates of the sample/hold capacitors 108 are disconnected from the differential input 102. After another predetermined period of time, the feedback switches 116 are turned on (at a logic high level). The left-side plates of the sample/hold capacitors 108 are connected to output terminals of the OTA 106 through the feedback switches 116. This is called "flip-around," where the left-side plates of the sample/hold capacitors 108 are "flipped" from the differential input 102 to the output terminals of the OTA 106. The values of the differential input voltage signals stored on the sample/hold capacitors 108 are held at the output terminals of the OTA 106 and passed to the loading capacitors 114.

SUMMARY

In accordance with the teachings described herein, systems and methods are provided for charge compensation. A system may include an operational transconductance amplifier including an input terminal and an output terminal, a transistor network, and a capacitive circuit. The transistor network may be coupled in a feedback loop between the input terminal and the output terminal. The capacitive circuit may be configured to compensate a charge built on a parasitic capacitance of the transistor network during operation.

As further examples, the transistor network may include a first transistor, the first transistor including a first transistor terminal and a second transistor terminal. The input terminal is coupled, directly or indirectly, to the first transistor terminal. The output terminal is coupled, directly or indirectly, to the second transistor terminal. The parasitic capacitance of the transistor network is the gate-drain capacitance of the first transistor. The capacitive circuit includes a first capacitor, the first capacitor being coupled to the output terminal. The transistor network is configured to receive a first signal, the charge being built on the parasitic capacitance in response to the first signal. The capacitive circuit is configured to receive a second signal, a second charge being generated from the capacitive circuit in response to the second signal to compensate the charge. The first signal is a step signal changing from a high voltage to a low voltage, and the second signal is a step signal changing from a low voltage to a high voltage. Or the first signal is a step signal changing from a low voltage to a high voltage, and the second signal is a step signal changing from a high voltage to a low voltage.

As another example, a system may include a first operational transconductance amplifier including a first input terminal, a second input terminal, a first output terminal, and a second output terminal, a first transistor network, a second transistor network, a first capacitive circuit, and a second capacitive circuit. The first transistor network is coupled in a feedback loop between the first input terminal and the first output terminal. The second transistor network is coupled in a feedback loop between the second input terminal and the second output terminal. The first capacitive circuit is configured to compensate a first charge built on a first parasitic capacitance of the first transistor network during operation. The second capacitive circuit is configured to compensate a second charge built on a second parasitic capacitance of the second transistor network during operation.

As additional examples, the first transistor network may be configured to receive a first signal, the first charge being built on the first parasitic capacitance in response to the first signal. The first capacitive circuit is configured to receive a second signal, a third charge being generated from the first capacitive circuit in response to the second signal to compensate the first charge. The first signal is a step signal changing from a high voltage to a low voltage, and the second signal is a step signal changing from a low voltage to a high voltage.

As further examples, the second transistor network may be configured to receive a first signal, the second charge being built on the second parasitic capacitance in response to the first signal. The second capacitive circuit is configured to receive a second signal, a third charge being generated from the second capacitive circuit in response to the second signal to compensate the second charge. The first signal is a step signal changing from a low voltage to a high voltage, and the second signal is a step signal changing from a high voltage to a low voltage.

As additional examples, the first capacitive circuit may include a first capacitor, the first capacitor being coupled to the first output terminal. The second capacitive circuit includes a second capacitor, the second capacitor being coupled to the second output terminal. The first transistor network includes a first transistor. The first transistor includes a first gate, a first source, and a first drain. The first input terminal is coupled, directly or indirectly, to the first source. The first output terminal is coupled, directly or indirectly, to the first gate. The second transistor network includes a second transistor, the second transistor including a second gate, a second source, and a second drain. The second input terminal is coupled, directly or indirectly, to the second source. The second output terminal is coupled, directly or indirectly, to the second gate.

As further examples, the system may further include a third transistor including a third gate, a third source, and a third drain. A fourth transistor including a fourth gate, a fourth source, and a fourth drain. The third drain is coupled to the first source. The fourth drain is coupled to the second source. The third source is coupled to the fourth source. The third transistor is configured to receive a first input signal at the third gate. The fourth transistor is configured to receive a second input signal at the fourth gate. The first transistor is configured to generate a first output signal at the first drain. The second transistor is configured to generate a second output signal at the second drain. The first capacitive circuit is coupled, directly or indirectly, between the first gate and the second drain. The second capacitive circuit is coupled, directly or indirectly, between the second gate and the first drain.

As additional examples, the system may further include a second operational transconductance amplifier including a third input terminal, a fourth input terminal, a third output terminal, and a fourth output terminal, a third transistor network, a fourth transistor network, a third capacitive circuit, and a fourth capacitive circuit. The third transistor network is coupled in a feedback loop between the third input terminal and the third output terminal. The fourth transistor network is coupled in a feedback loop between the fourth input terminal and the fourth output terminal. The third capacitive circuit is configured to compensate a charge built on a parasitic capacitance of the third transistor network during operation. The fourth capacitive circuit is configured to compensate a charge built on a parasitic capacitance of the fourth transistor network during operation. The third transistor network is coupled to the first transistor network. The fourth transistor network is coupled to the second transistor network.

As another example, a method is provided for charge compensation. A first signal is received at a transistor network, a transistor network being coupled in a feedback loop between an input terminal and an output terminal of an operational transconductance amplifier. A first charge is generated on a parasitic capacitance of the transistor network in response to the first signal. A second signal is received at a capacitive circuit. A second charge is generated from the capacitive circuit in response to the second signal. The second charge is provided to compensate the first charge.

As additional examples, the first signal may be a step signal changing from a high voltage to a low voltage. The second signal may be a step signal changing from a low voltage to a high voltage.

DETAILED DESCRIPTION

In many cases, performance of an ADC may depend on a slew rate of an OTA implemented in the ADC. A slew rate is the maximum rate at which an output signal can change due to a large change in an input signal. A high slew rate of an OTA may be achieved with high bias currents for the OTA. There is thus a trade-off between the slew rate and power consumption of the OTA. It is desirable to achieve a high slew rate with low power consumption (e.g., low bias currents).

Figure 1A:
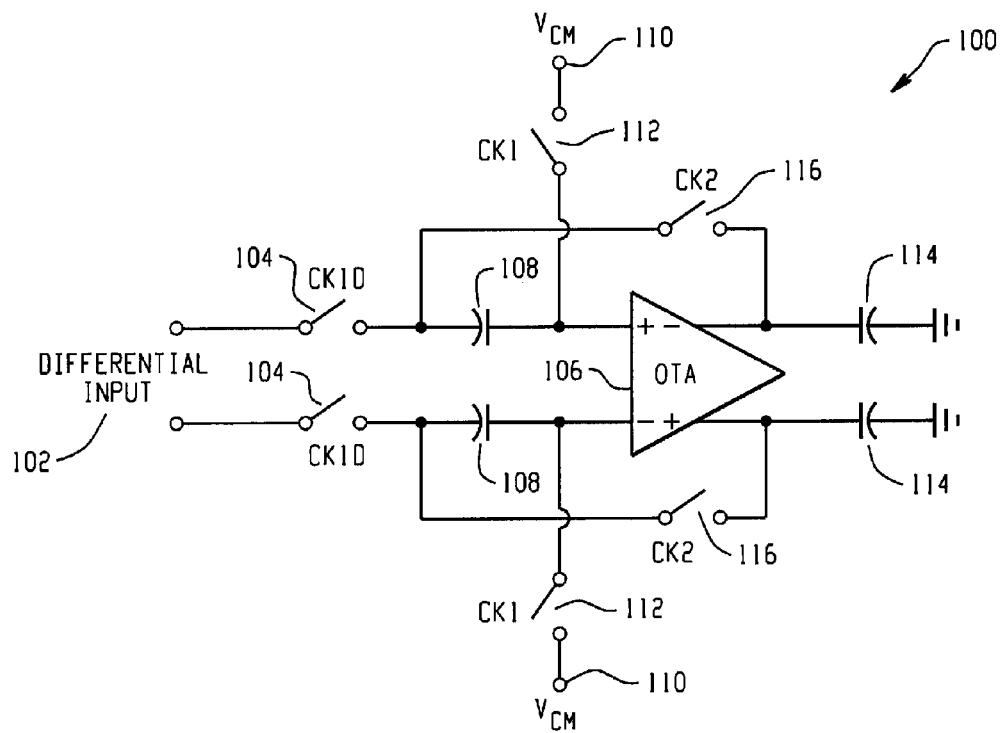
FIGS. 1A and 1B show an example of a diagram of a flip-around sample/hold circuit of ADCs and an example of timing diagrams of switches in the diagram of the sample/hold circuit.
Figure 1B:
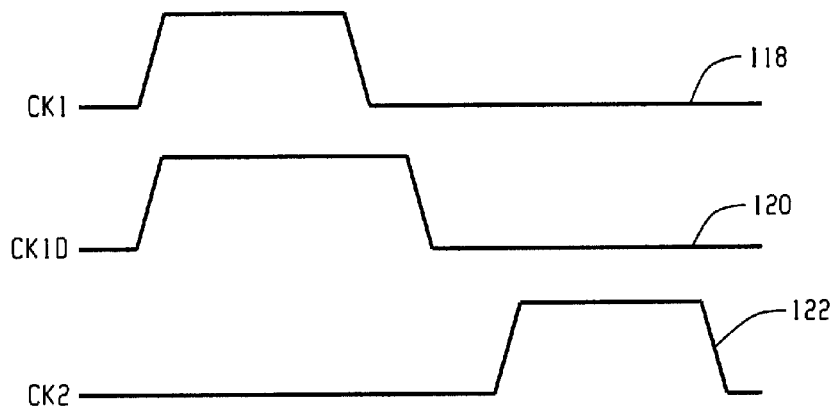
Figures 2A, 2B:
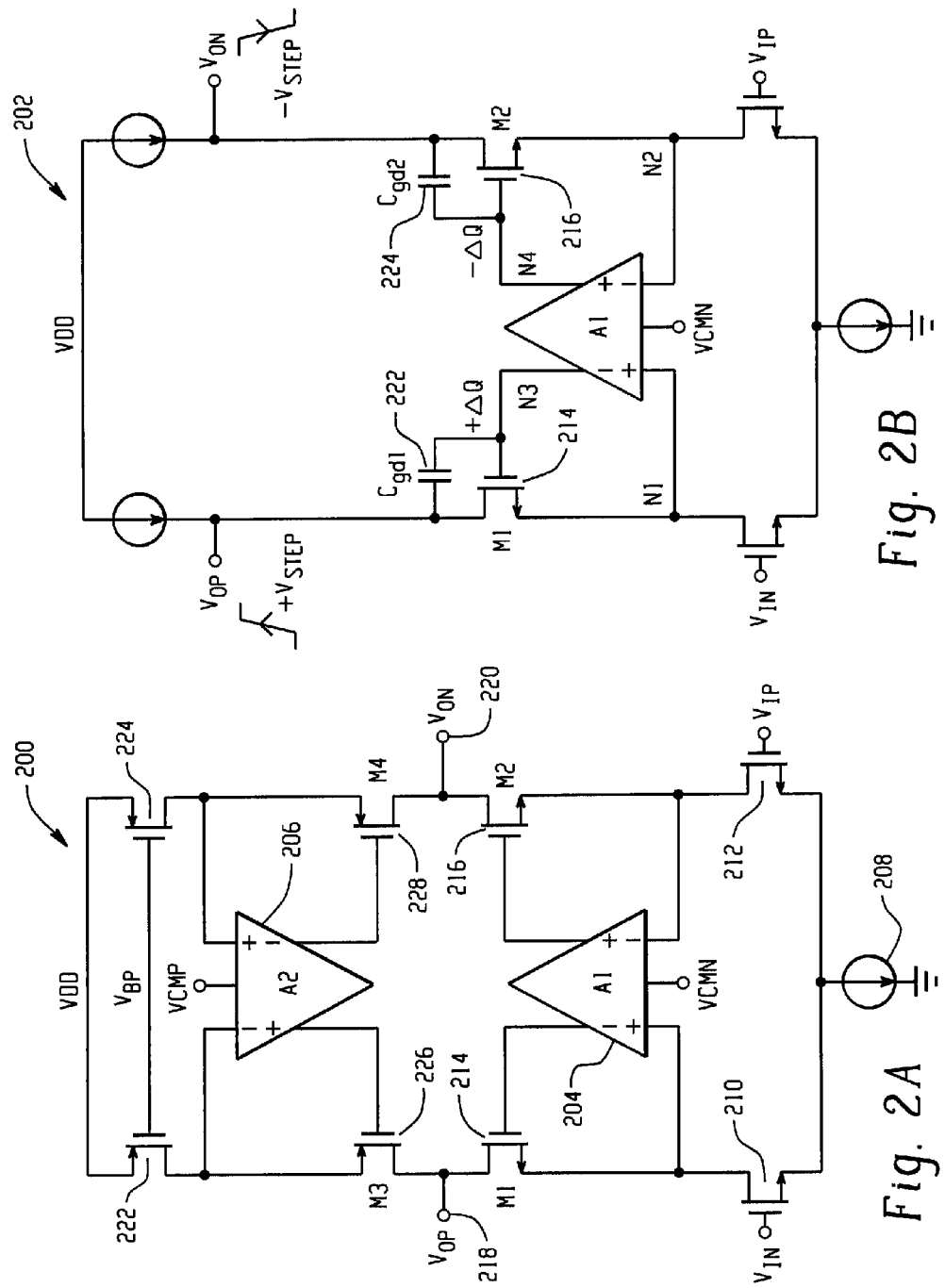
FIGS. 2A and 2B show a diagram of an example of a gain-boost OTA and a simplified diagram of the gain-boost OTA, respectively.

FIGS. 2A and 2B show a diagram of an example of a gain-boost OTA 200 and a simplified diagram of the example of a gain-boost OTA 202, respectively. As shown in FIG. 2A, the gain-boost OTA 200 contains two internal OTAs 204 and 206. As an example, the internal OTAs 204 and 206 are fully differential amplifiers, receiving differential input voltages and generating differential output voltages. A current source 208 provides bias currents for the gain-boost OTA 200.

External input voltage signals are received at gate terminals of transistors 210 and 212. Drain voltages of the transistors 210 and 212 are provided, as internal input signals, to the internal OTA 204, which generates internal output signals at gate terminals of transistors 214 and 216. The transistors 214 and 216 are coupled in two feedback loops of the internal OTA 204, respectively. Similarly, the internal OTA 206 receives internal input signals from drain terminals of transistors 222 and 224, and generates internal output signals at gate terminals of transistors 226 and 228. The transistors 226 and 228 are coupled to the transistors 214 and 216, respectively. External output voltage signals of the gain-boost OTA 200 are generated at external output terminals 218 and 220.

A bias current of an OTA for a given slew rate may be determined by the following equation:

$$I_{slew\text{-}rate} = \Delta V \cdot C / T_{slew\text{-}rate}, \qquad (1)$$

where ΔV represents a change of an output signal of an OTA, $T_{slew\text{-}rate}$ represents a time required for an output signal to change in response to a change in an input signal, C represents an output capacitance of the OTA. For a given slew rate, the bias current may be proportional to ΔV.

According to equation (1), a bias current of the internal OTA 204 is affected by $\Delta V_{OA1}$, a change of differential output signals of the internal OTA 204. $\Delta V_{OA1}$ may be determined based on the following equation:

$$\Delta V_{OA1} = \Delta V_1 - \Delta V_2,$$

where $\Delta V_1$ and $\Delta V_2$ represent changes of the internal output signals at the gate terminals of transistors 214 and 216, respectively.

In reality, the value of $\Delta V_{OA1}$ may be much larger than an ideal value determined based on a voltage gain of the gain-boost OTA 200 (e.g., the voltage gain from the output terminals of the internal OTA 204 to the external output terminals 218 and 220). Thus, the bias current of the internal OTA 204 may be much larger than an ideal bias current. Many factors may contribute to a non-ideal $\Delta V_{OA1}$, including parasitic capacitances.

As shown in FIG. 2B, the transistor 214 may have a parasitic gate-drain capacitance 222. For example, when the output voltage signal $V_{OP}$ is a step signal changing from a low voltage to a high voltage, a positive charge +ΔQ may be built on the gate-drain capacitance 222. Similarly, a negative charge −ΔQ may be built on a parasitic gate-drain capacitance 224, when the output voltage signal $V_{ON}$ is a step signal changing from a high voltage to a low voltage. Under these circumstances, assuming the transistors 214 and 216 are the same, $\Delta V_{OA1}$ may be determined based on the following equation:

$$\Delta V_{OA1} = 2 * \frac{\Delta Q}{C_{gd} + C_p} = 2 * \frac{V_{STEP} * C_{gd}}{C_{gd} + C_p},$$

where $2V_{STEP}$ represents the sum of the magnitude of the change of $V_{OP}$ and the magnitude of the change of $V_{ON}$, $C_{gd}$ represents the gate-drain capacitance of the transistor 214, and $C_p$ represents a parasitic capacitance of the transistor 214 other than $C_{gd}$.

For example, the voltage gain of the gain-boost OTA 202 may be about 20 dB. The ideal $\Delta V_{OA1}$ may be about 10% of $2V_{STEP}$. In many designs of the internal OTA 204, $$\frac{C_{gd}}{C_{gd} + C_p}$$

is around 0.3, and thus $\Delta V_{OA1}$ could be close to 30% of $2V_{STEP}$ which is much larger than the ideal $\Delta V_{OA1}$. Thus, according to equation (1), the bias current of the internal OTA 204 is much larger than the ideal value, and thus the power consumption of the internal OTA 204 may be non-ideal.

Figure 3:
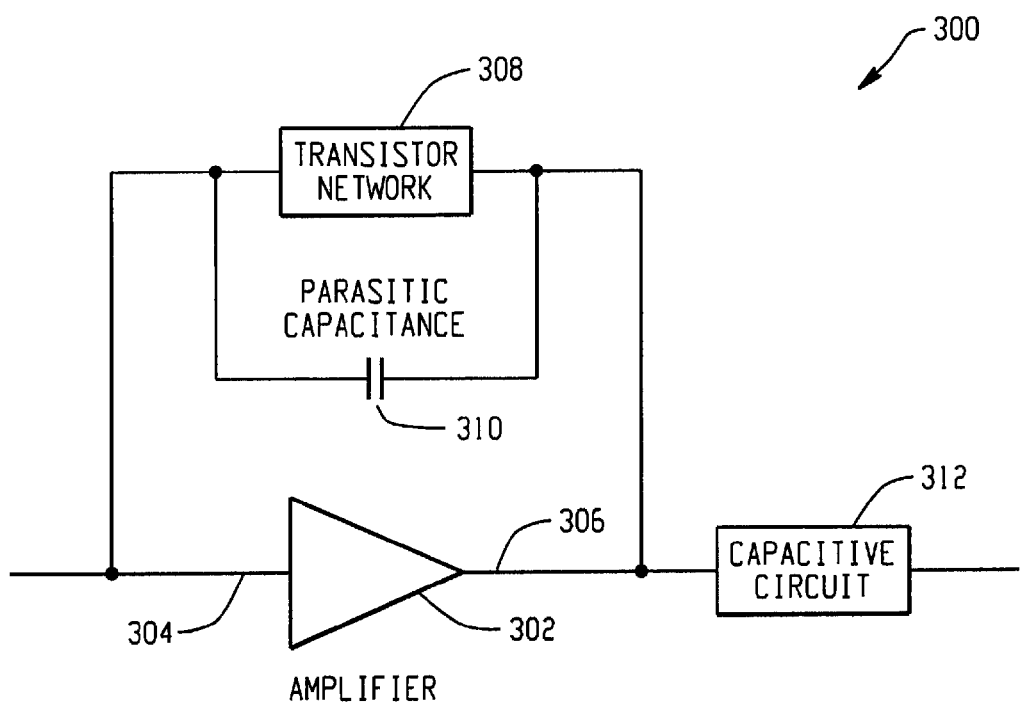
FIG. 3 shows an example of a diagram of a system for charge compensation.

FIG. 3 shows at 300 an example of a diagram of a system for charge compensation. An operational amplifier 302 has an input terminal 304 and an output terminal 306. A transistor network 308 is coupled in a feedback loop of the operational amplifier 302 between the output terminal 306 and the input terminal 304. A charge may be built on a parasitic capacitance 310 of the transistor network 308 during operation. A capacitive circuit 312 may be coupled, directly or indirectly, to the output terminal 306 to compensate the charge built on the parasitic capacitance 310, and in turn to lower a bias current in the operational amplifier 302.

Figure 4:
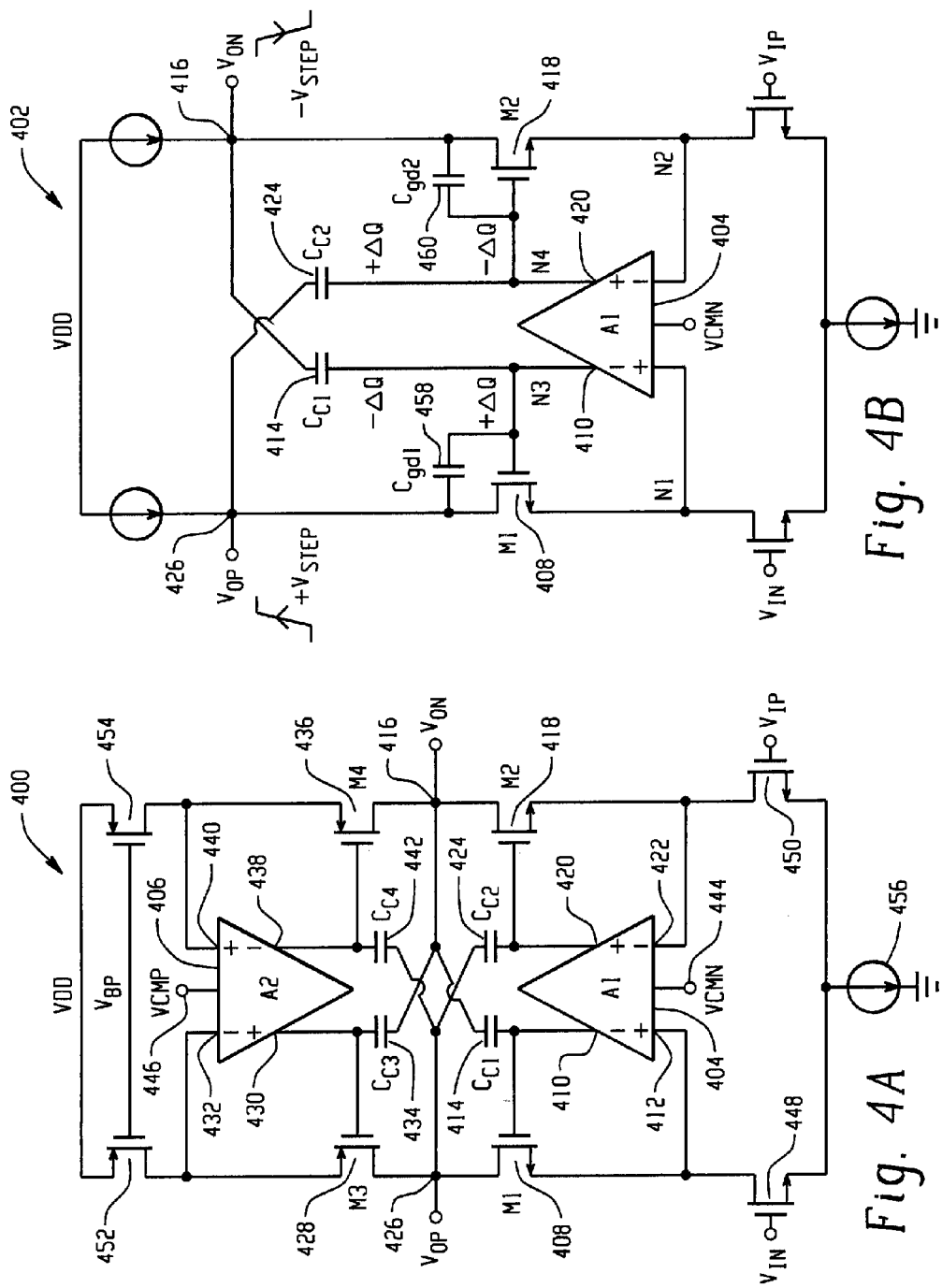
FIGS. 4A and 4B show an example of a diagram of an OTA including a capacitive circuit for charge compensation and a simplified diagram of the OTA including a capacitive circuit for charge compensation.

FIGS. 4A and 4B show an example of a diagram of an OTA including a capacitive circuit for charge compensation at 400 and a simplified diagram of the OTA including a capacitive circuit for charge compensation at 402. As shown in FIG. 4A, the OTA contains two internal OTAs 404 and 406 which may have similar structures. A transistor 408 is coupled in a feedback loop between an internal output terminal 410 and an internal input terminal 412 of the internal OTA 404. A compensation capacitor 414 is coupled between the internal output terminal 410 and an external output terminal 416 of the OTA. Further, a transistor 418 is coupled in a feedback loop between an internal output terminal 420 and an internal input terminal 422 of the internal OTA 404. A compensation capacitor 424 is coupled between the internal output terminal 420 and an external output terminal 426 of the OTA.

Similar circuits may be constructed for the internal OTA 406. A transistor 428 is coupled in a feedback loop between an internal output terminal 430 and an internal input terminal 432 of the internal OTA 406. A compensation capacitor 434 is coupled between the internal output terminal 430 and the external output terminal 416. Further, a transistor 436 is coupled in a feedback loop between an internal output terminal 438 and an internal input terminal 440 of the internal OTA 406. A compensation capacitor 442 is coupled between the internal output terminal 438 and the external output terminal 426. The internal OTAs 404 and 406 may include reference input terminals 444 and 446, respectively, for receiving reference input voltage signals.

The OTA may include additional components. For example, the OTA may receive external input voltage signals at the gate terminals of transistors 448 and 450. Transistors 452 and 454 may be configured to provide mirror currents.

As shown in FIG. 4B, charges built on parasitic capacitances 458 and 460 may be compensated by charges introduced from the compensation capacitors 414 and 424, respectively. For example, when the external output voltage signal $V_{OP}$ at the external output terminal 426 is a step signal changing from a low voltage to a high voltage, a positive charge +ΔQ may be built on the parasitic capacitance 458 (i.e., the gate-drain capacitance of the transistor 408) and be coupled to the internal output terminal 410. On the other hand, the external output voltage signal $V_{ON}$ at the external output terminal 416 is a step signal changing from a high voltage to a low voltage, and thus the compensation capacitor 414 may introduce a negative charge −ΔQ to compensate the positive charge +ΔQ from the parasitic capacitance 458.

A net coupling charge at the internal output terminal 410 may be determined based on the following equation:

$$\Delta Q_1 = V_{STEP} * C_{gd1} + (-V_{STEP}) * C_{C1},$$

where $V_{STEP}$ represents the change of the output voltage signal $V_{OP}$, $(-V_{STEP})$ represents the change of the output voltage signal $V_{ON}$, $C_{gd1}$ represents the gate-drain capacitance 458, and $C_{C1}$ represents the capacitance of the capacitor 414. If $C_{C1}$ is chosen to be the same as $C_{gd1}$, then the charge built on the parasitic capacitance 458 may be cancelled by the charge introduced from the compensation capacitor 414, and the net coupling charge at the internal output terminal 410 is zero.

Similarly, a net coupling charge at the internal output terminal 420 may be determined based on the following equation:

$$\Delta Q_2 = (-V_{STEP}) * C_{gd2} + V_{STEP} * C_{C2},$$

where $V_{STEP}$ represents the change of the output voltage signal $V_{OP}$, $(-V_{STEP})$ represents the change of the output voltage signal $V_{ON}$, $C_{gd2}$ represents the gate-drain capacitance 460, and $C_{C2}$ represents the capacitance of the capacitor 424. $\Delta V_{O4}$, a change of differential output signals of the internal OTA 404, may be proportional to the difference of $\Delta Q_1$ and $\Delta Q_2$. $C_{C1}$ and $C_{C2}$ may be properly chosen to reduce $\Delta V_{O4}$, and thus reduce a bias current of the internal OTA 404 to achieve low power consumption.

For example, nodes N3/N4 shown in FIG. 4B may be virtually grounded by the above-described cross-couple charge compensation. Then, a current tail 456 shown in FIG. 4A may be more efficiently delivered to an output of the OTA, compared to a traditional design as shown in FIG. 2A.

Figure 5:
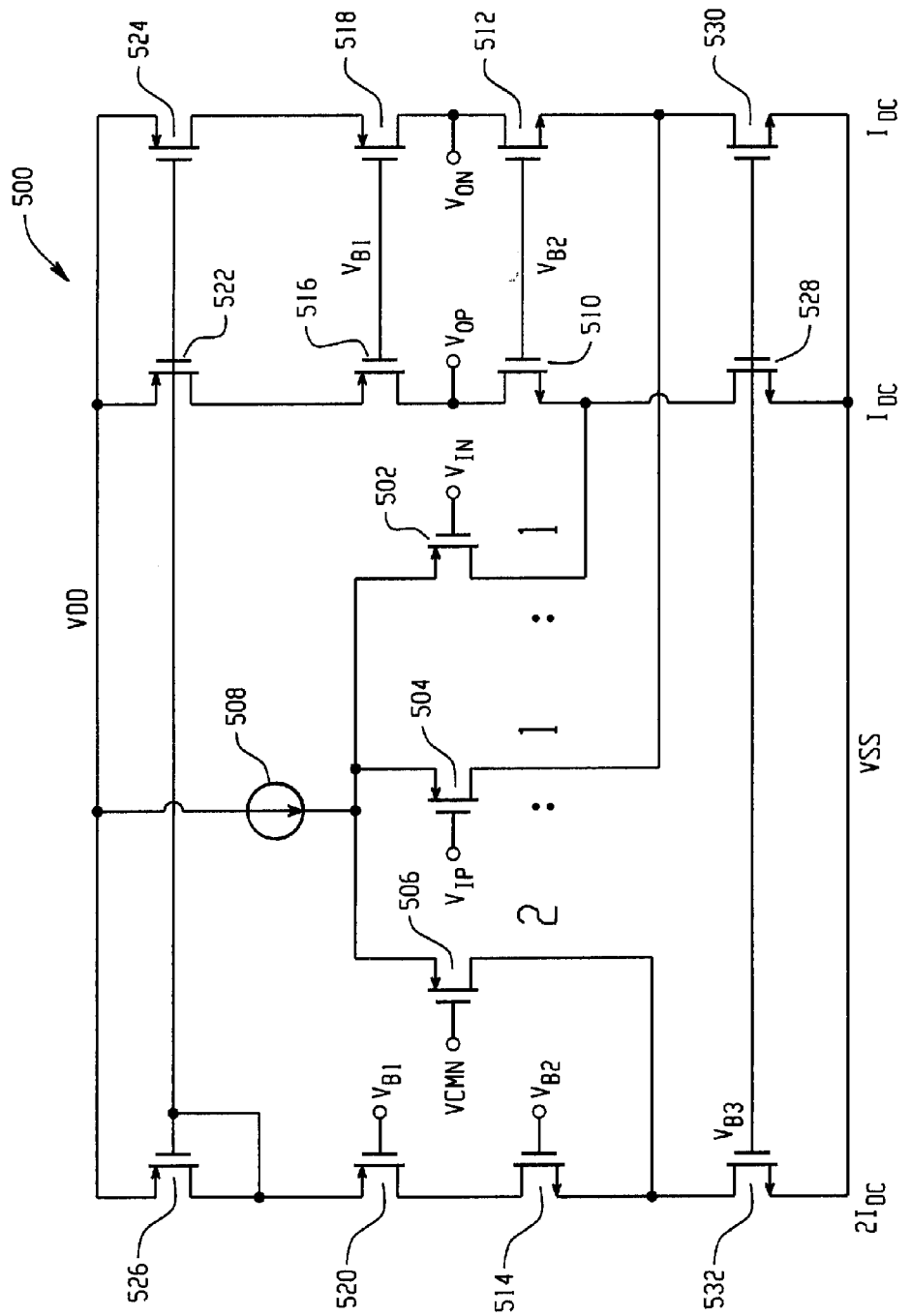
FIG. 5 shows an example of a diagram of an internal OTA.

Various OTA designs may be implemented for the internal OTAs 404 and 406. FIG. 5 shows at 500 an example of a diagram of an internal OTA. Transistors 502 and 504 may be configured to receive differential input voltage signals, $V_{IN}$ and $V_{IP}$, and a transistor 506 may be configured to receive a reference input voltage signal $V_{CMN}$. For example, the magnitude of the current flowing through the transistor 506 may be twice the magnitude of the current flowing through the transistor 502. The magnitude of the current flowing through the transistor 502 may be the same as the magnitude of the current flowing through the transistor 504.

A current source 508 may provide bias currents in the internal OTA. Cascoding transistors 510, 512 and 514 may be biased at a common gate voltage $V_{B2}$, and cascoding transistors 516, 518 and 520 may be biased at a common gate voltage $V_{B1}$. Transistors 522, 524, and 526 constitute a current mirror circuit, and transistors 528, 530, and 532 constitute another current mirror circuit.

Figure 6:
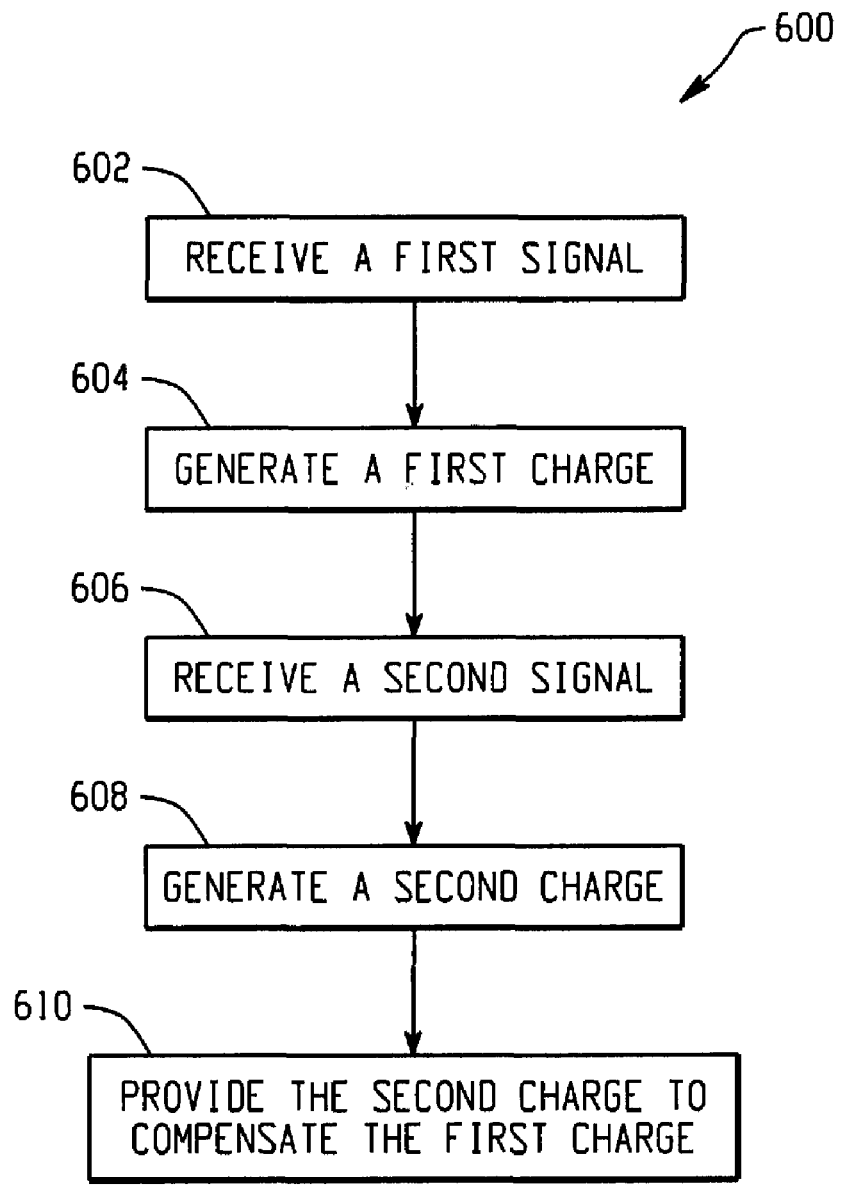
FIG. 6 shows an example of a flow chart of charge compensation.

FIG. 6 shows at 600 an example of a flow chart of charge compensation. At 602, a first signal is received at a transistor network. The transistor network is coupled in a feedback loop between an input terminal and an output terminal of an operational transconductance amplifier. A first charge is generated at 604 on a parasitic capacitance of the transistor network in response to the first signal. At 606, a second signal is received at a capacitive circuit that is coupled, directly or indirectly, to the output terminal of the operational transconductance amplifier. A second charge is generated at 608 from the capacitive circuit in response to the second signal. At 610, the second charge is provided to compensate the first charge.

For example, when the first signal is a step signal changing from a low voltage to a high voltage, a positive charge $+\Delta Q$ may be built on the parasitic capacitance of the transistor network. The second signal may be a step signal changing from a high voltage to a low voltage, and thus the capacitive circuit may introduce a negative charge $-\Delta Q$ to compensate the positive charge $+\Delta Q$ from the parasitic capacitance of the transistor network.

Figure 7:
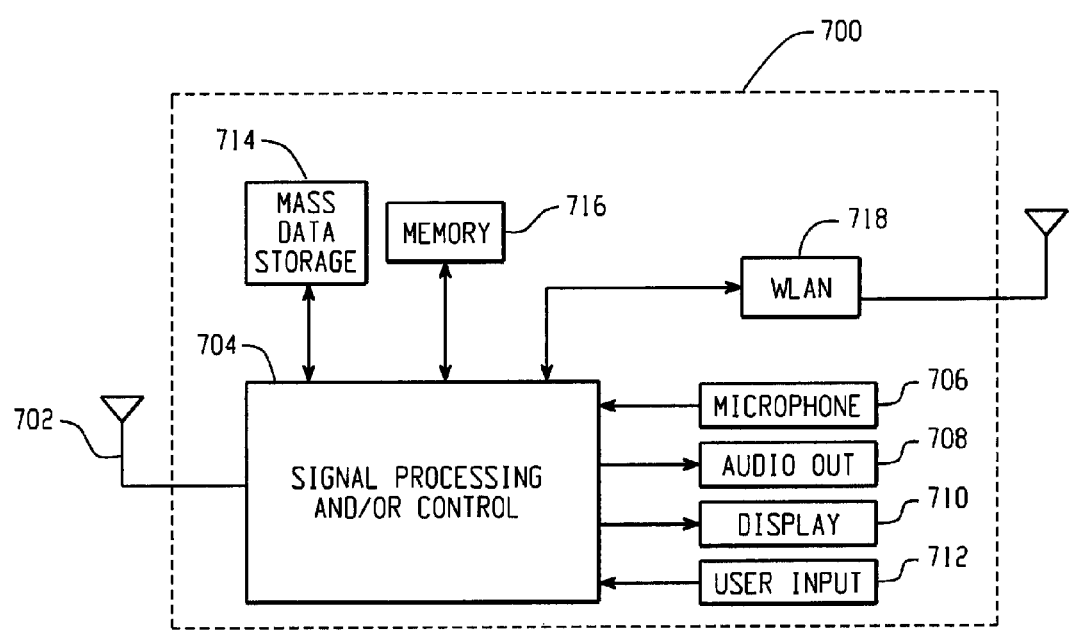
FIG. 7 shows an example of a system that may utilize a time-interleaved pipeline ADC.

FIG. 7 shows an example of a system 700 that may utilize a time-interleaved pipeline ADC. As shown in FIG. 7, a system utilizing a time-interleaved pipeline ADC may include a signal processing and/or control circuit 704, such as a microprocessor or DSP, a user input 712, a mass data storage 714, a memory 716, and/or wired/wireless communication circuitry 718. In different embodiments, the system illustrated in FIG. 7 may be included (in whole or in part) in a cellular telephone, a computer, a hard disk drive (HDD), a DVD player/drive, a television, a set-top box, a vehicle, a digital media player and/or other suitable systems or devices.

For example, the system 700 may communicate with a host device (not shown) such as a computer, mobile computing devices such as personal digital assistants, cellular phones, media or MP3 players and the like, and/or other devices via the wired/wireless communication circuitry 718. The system 700 may include an antenna 702, a microphone 706, an audio output 708 such as a speaker and/or audio output jack, a display 710 and/or an input device 712 such as a keypad, pointing device, voice actuation and/or other input device. The signal processing and/or control circuits 704 and/or other circuits (not shown) in the system 700 may process data, perform coding and/or encryption, perform calculations, format data and/or perform other functions of a cellular telephone, a HDD, or a DVD player/drive.

As another example, the system 700 may communicate with the mass data storage 714 that stores data in a nonvolatile manner such as optical and/or magnetic storage devices such as HDDs and/or DVDs. The HDD may be a mini HDD that includes one or more platters having a diameter that is smaller than approximately 1.8". The system 700 may be connected to memory 716 such as RAM, ROM, low latency nonvolatile memory such as flash memory and/or other suitable electronic data storage. The signal processing and/or control circuit 704 and/or other circuits (not shown) in the system 700 may process data, perform coding and/or encryption, perform calculations, and/or format data that is output to and/or received from the optical and/or magnetic storage devices.

This written description uses examples to disclose the invention, include the best mode, and also to enable a person skilled in the art to make and use the invention. The patentable scope of the invention may include other examples that occur to those skilled in the art.

We claim:

1. A system comprising:
   an operational transconductance amplifier including an input terminal and an output terminal;
   a transistor network having a parasitic capacitance configured to store a charge, the transistor network being coupled in a feedback loop between the input terminal and the output terminal, wherein the transistor network includes a transistor, the transistor including a gate and a source, and wherein the input terminal is coupled, directly or indirectly, to the source, and the output terminal is coupled, directly or indirectly, to the gate; and
   a capacitive circuit configured to compensate for the charge stored on the parasitic capacitance of the transistor network.

2. The system of claim 1, wherein the parasitic capacitance of the transistor network is a gate-drain capacitance of the transistor.

3. The system of claim 1, wherein the capacitive circuit includes a first capacitor, the first capacitor being coupled to the output terminal.

4. The system of claim 1, wherein the transistor network is configured to receive a first signal, the charge being built on the parasitic capacitance in response to the first signal, and wherein the capacitive circuit is configured to receive a second signal, a second charge being generated from the capacitive circuit in response to the second signal to compensate the charge.

5. The system of claim 4, wherein the first signal is a step signal changing from a high voltage to a low voltage, and the second signal is a step signal changing from a low voltage to a high voltage.

6. The system of claim 4, wherein the first signal is a step signal changing from a low voltage to a high voltage, and the second signal is a step signal changing from a high voltage to a low voltage.

7. A system comprising:
a first operational transconductance amplifier including a first input terminal, a second input terminal, a first output terminal, and a second output terminal;
a first transistor network having a first parasitic capacitance configured to store a first charge, the first transistor network being coupled in a feedback loop between the first input terminal and the first output terminal, wherein the first transistor network includes a first transistor, the first transistor including a first gate, a first source, and a first drain, wherein the first input terminal is coupled, directly or indirectly, to the first source, wherein the first output terminal is coupled, directly or indirectly, to the first gate, and wherein the first transistor is configured to generate a first output signal at the first drain;
a second transistor network having a second parasitic capacitance configured to store a second charge, the second transistor network being coupled in a feedback loop between the second input terminal and the second output terminal;
a first capacitive circuit configured to compensate for the first charge stored on the first parasitic capacitance of the first transistor network; and
a second capacitive circuit configured to compensate for the second charge stored on the second parasitic capacitance of the second transistor network.

8. The system of claim 7, wherein the first transistor, network is configured to receive a first signal, the first charge being built on the first parasitic capacitance in response to the first signal, and wherein the first capacitive circuit is configured to receive a second signal, a third charge being generated from the first capacitive circuit in response to the second signal to compensate the first charge.

9. The system of claim 8, wherein the first signal is a step signal changing from a high voltage to a low voltage, and the second signal is a step signal changing from a low voltage to a high voltage.

10. The system of claim 7, wherein the second transistor network is configured to receive a first signal, the second charge being built on the second parasitic capacitance in response to the first signal, and wherein the second capacitive circuit is configured to receive a second signal, a third charge being generated from the second capacitive circuit in response to the second signal to compensate the second charge.

11. The system of claim 10, wherein the first signal is a step signal changing from a low voltage to a high voltage, and the second signal is a step signal changing from a high voltage to a low voltage.

12. The system of claim 7, wherein the first capacitive circuit includes a first capacitor, the first capacitor being coupled to the first output terminal, and wherein the second capacitive circuit includes a second capacitor, the second capacitor being coupled to the second output terminal.

13. The system of claim 7, wherein:
the second transistor network includes a second transistor, the second transistor including a second gate, a second source, and a second drain;
the second input terminal is coupled, directly or indirectly, to the second source;
the second output terminal is coupled, directly or indirectly, to the second gate; and
the second transistor is configured to generate a second output signal at the second drain.

14. The system of claim 13, further comprising:
a third transistor including a third gate, a third source, and a third drain, the third drain being coupled to the first source, the third source being coupled to the fourth source, and the third transistor being configured to receive a first input signal at the third gate; and
a fourth transistor including a fourth gate, a fourth source, and a fourth drain, the fourth drain being coupled to the second source, and the fourth transistor being configured to receive a second input signal at the fourth gate.

15. The system of claim 14, wherein the first capacitive circuit is coupled, directly or indirectly, between the first gate and the second drain, and wherein the second capacitive circuit is coupled, directly or indirectly, between the second gate and the first drain.

16. The system of claim 7, further comprising:
a second operational transconductance amplifier including a third input terminal, a fourth input terminal, a third output terminal, and a fourth output terminal;
a third transistor network having a third parasitic capacitance configured to store a third charge, the third transistor network being coupled in a feedback loop between the third input terminal and the third output terminal and coupled to the first transistor network;
a fourth transistor network having a fourth parasitic capacitance configured to store a fourth charge, the fourth transistor network being coupled in a feedback loop between the fourth input terminal and the fourth output terminal and coupled to the second transistor network;
a third capacitive circuit configured to compensate the third charge stored on the third parasitic capacitance of the third transistor network; and
a fourth capacitive circuit configured to compensate the fourth charge stored on the fourth parasitic capacitance of the fourth transistor network.

17. A method for charge compensation, the method comprising:
receiving a first signal at a transistor network, a transistor network being coupled in a feedback loop between an input terminal and an output terminal of an operational transconductance amplifier, wherein the transistor network includes a transistor, the transistor including a gate and a source, and wherein the input terminal is coupled, directly or indirectly, to the source, and the output terminal is coupled, directly or indirectly, to the gate;
generating a first charge on a parasitic capacitance of the transistor network in response to the first signal;
receiving a second signal at a capacitive circuit;
generating a second charge from the capacitive circuit in response to the second signal; and
providing the second charge to compensate the first charge.

18. The method of claim 17, wherein the first signal is a step signal changing from a high voltage to a low voltage, and the second signal is a step signal changing from a low voltage to a high voltage.

* * * * *